US007926013B2

(12) United States Patent
Elikan et al.

(10) Patent No.: US 7,926,013 B2
(45) Date of Patent: Apr. 12, 2011

(54) VALIDATING CONTINUOUS SIGNAL PHASE MATCHING IN HIGH-SPEED NETS ROUTED AS DIFFERENTIAL PAIRS

(75) Inventors: Howard L. Elikan, Chandler, AZ (US); Andrew McRonald, Beaverton, OR (US); Dennis Miller, Sherwood, OR (US)

(73) Assignee: Intel Corporation, Santa Clara, CA (US)

(*) Notice: Subject to any disclaimer, the term of this patent is extended or adjusted under 35 U.S.C. 154(b) by 565 days.

(21) Appl. No.: 12/006,281

(22) Filed: Dec. 31, 2007

(65) Prior Publication Data
US 2009/0172629 A1   Jul. 2, 2009

(51) Int. Cl.
*G06F 17/50* (2006.01)
(52) U.S. Cl. ......... 716/113; 716/104; 716/132; 716/136
(58) Field of Classification Search .................. 716/104, 716/113, 132, 136
See application file for complete search history.

(56) References Cited

U.S. PATENT DOCUMENTS

| | | | |
|---|---|---|---|
| 4,847,754 A | 7/1989 | Obermarck et al. | |
| 5,548,728 A | 8/1996 | Danknick | |
| 6,307,789 B1 | 10/2001 | Wolrich et al. | |
| 6,311,237 B1 | 10/2001 | Suzuki et al. | |
| 6,324,624 B1 | 11/2001 | Wolrich et al. | |
| 6,427,196 B1 | 7/2002 | Adiletta et al. | |
| 6,463,072 B1 | 10/2002 | Wolrich et al. | |
| 6,532,509 B1 | 3/2003 | Wolrich et al. | |
| 6,560,667 B1 | 5/2003 | Wolrich et al. | |
| 6,594,701 B1 | 7/2003 | Forin | |
| 6,625,654 B1 | 9/2003 | Wolrich et al. | |
| 6,625,689 B2 | 9/2003 | Narad et al. | |
| 6,661,794 B1 | 12/2003 | Wolrich et al. | |
| 6,694,380 B1 | 2/2004 | Wolrich et al. | |
| 6,728,845 B2 | 4/2004 | Adiletta et al. | |
| 6,779,084 B2 | 8/2004 | Wolrich et al. | |
| 6,789,143 B2 | 9/2004 | Craddock et al. | |
| 7,158,964 B2 | 1/2007 | Wolrich et al. | |
| 7,405,598 B2 * | 7/2008 | Goh et al. ........................ | 326/86 |
| 2003/0115347 A1 | 6/2003 | Wolrich et al. | |
| 2003/0135351 A1 | 7/2003 | Wilkinson et al. | |
| 2003/0140196 A1 | 7/2003 | Wolrich et al. | |

(Continued)

FOREIGN PATENT DOCUMENTS

FR          2792086 A1     4/1999

OTHER PUBLICATIONS

Halfhill, Tom R., "Intel Network Processor Targets Routers", IXP1200Integrates Seven Cores for Multithreaded Packet Routing, Microprocessor Report, vol. 13, No. 12, Cahners, Sep. 13, 1999, 6 pages.

(Continued)

*Primary Examiner* — Thuan Do
(74) *Attorney, Agent, or Firm* — Caven & Aghevli LLC

(57) ABSTRACT

Methods and apparatus to validate continuous signal phase matching in high-speed nets routed as differential pairs are described. In one embodiment, a primary net of a differential pair may be traversed to determine whether a design rule violation has occurred based on comparison of calculated trace lengths of the primary net and a secondary net against a threshold value. Other embodiments are also described.

15 Claims, 4 Drawing Sheets

U.S. PATENT DOCUMENTS

| | | |
|---|---|---|
| 2003/0145173 A1 | 7/2003 | Wilkinson et al. |
| 2003/0147409 A1 | 8/2003 | Wolrich et al. |
| 2003/0191866 A1 | 10/2003 | Wolrich et al. |
| 2003/0212852 A1 | 11/2003 | Wolrich et al. |
| 2004/0004961 A1 | 1/2004 | Lakshmanamurthy et al. |
| 2004/0004964 A1 | 1/2004 | Lakshmanamurthy et al. |
| 2004/0004970 A1 | 1/2004 | Lakshmanamurthy et al. |
| 2004/0024821 A1 | 2/2004 | Hady |
| 2004/0034743 A1 | 2/2004 | Wolrich et al. |
| 2004/0073635 A1 | 4/2004 | Narad et al. |
| 2004/0093602 A1 | 5/2004 | Huston et al. |
| 2004/0098535 A1 | 5/2004 | Narad et al. |
| 2004/0111540 A1 | 6/2004 | Narad |
| 2004/0252686 A1 | 12/2004 | Hooper et al. |
| 2005/0018601 A1 | 1/2005 | Kalkunte et al. |
| 2005/0038964 A1 | 2/2005 | Hooper et al. |
| 2005/0039182 A1 | 2/2005 | Hooper et al. |
| 2005/0071602 A1 | 3/2005 | Niell et al. |
| 2006/0190689 A1 | 8/2006 | Van Niekerk |
| 2006/0277126 A1 | 12/2006 | Rosenbluth et al. |
| 2007/0005908 A1 | 1/2007 | Lakshmanamurthy et al. |

OTHER PUBLICATIONS

International Preliminary Report on Patentability and Written Opinion Received for PCT Patent Application No. PCT/US2006/014318, mailed on Oct. 16, 2007, 6 pages.

International Search Report and Written Opinion Received for PCT Patent Application No. PCT/US2006/014318, mailed on Oct. 17, 2006, 10 pages.

Jose, San "Cadence Continues Product-Segmentation Strategy With Allegro Silicon-Package-Board Platform", Cadence Design Systems, Inc., Apr. 26, 2006, 3 pages.

Di Lello, Vincent "Cadence Allegro Editor A New User's Experience (One year marinated)", Kaleidescape, Session No. 5.7, Sep. 28, 2006, 31 pages.

* cited by examiner

VALIDATING CONTINUOUS SIGNAL PHASE MATCHING IN HIGH-SPEED NETS ROUTED AS DIFFERENTIAL PAIRS

BACKGROUND

The present disclosure generally relates to the field of electronics. More particularly, an embodiment of the invention relates to validating continuous signal phase matching in high-speed nets routed as differential pairs.

To reduce costs and delays associated with fabricating circuit boards and packages, designs may be first simulated on a computer. More particularly, computer-aided drafting (CAD) or electronic design automation (EDA) tools may be used to check for design rule violations. Some implementations may provide design rule checks (DRCs) for differential pair signals by end-to-end length matching or length matching per layer. However, differential pair signals may be extensively used in some designs and more accurate and/or efficient DRCs may be required to reduce costs and delays associated with designing such products.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Some of the embodiments discussed herein may provide techniques for validating continuous signal phase matching in high-speed nets which are routed as differential pairs (e.g., such as those used in circuit boards and/or semiconductor packages). In one embodiment, a maximum distance between the point of phase mismatch detection and correction may be specified. In some embodiments, techniques discussed herein may be provided as a design rule check in a Layout Constraint Tool (LCT). Such tools may be used to verify the signal integrity of high-speed signals routed as differential pairs on packages and printed circuit boards (PCBs).

Furthermore, in one embodiment, an automated continuous phase matching DRC for differential pairs may be provided, in which length matching is checked at frequent intervals along the routing, including at points that are not necessarily endpoints of trace segments. Such a DRC may allow for the same part of the signal being affected by the same noise in each net. If the phase mismatch is corrected within a specified maximum correction distance, no violation may be reported by the DRC. Suppressing these "false-positive" violations can save users a great amount of time spent investigating and dispositioning false violations. Moreover, some embodiments may be provided in various environments, such as those discussed herein with reference to the figures.

Figure 1:
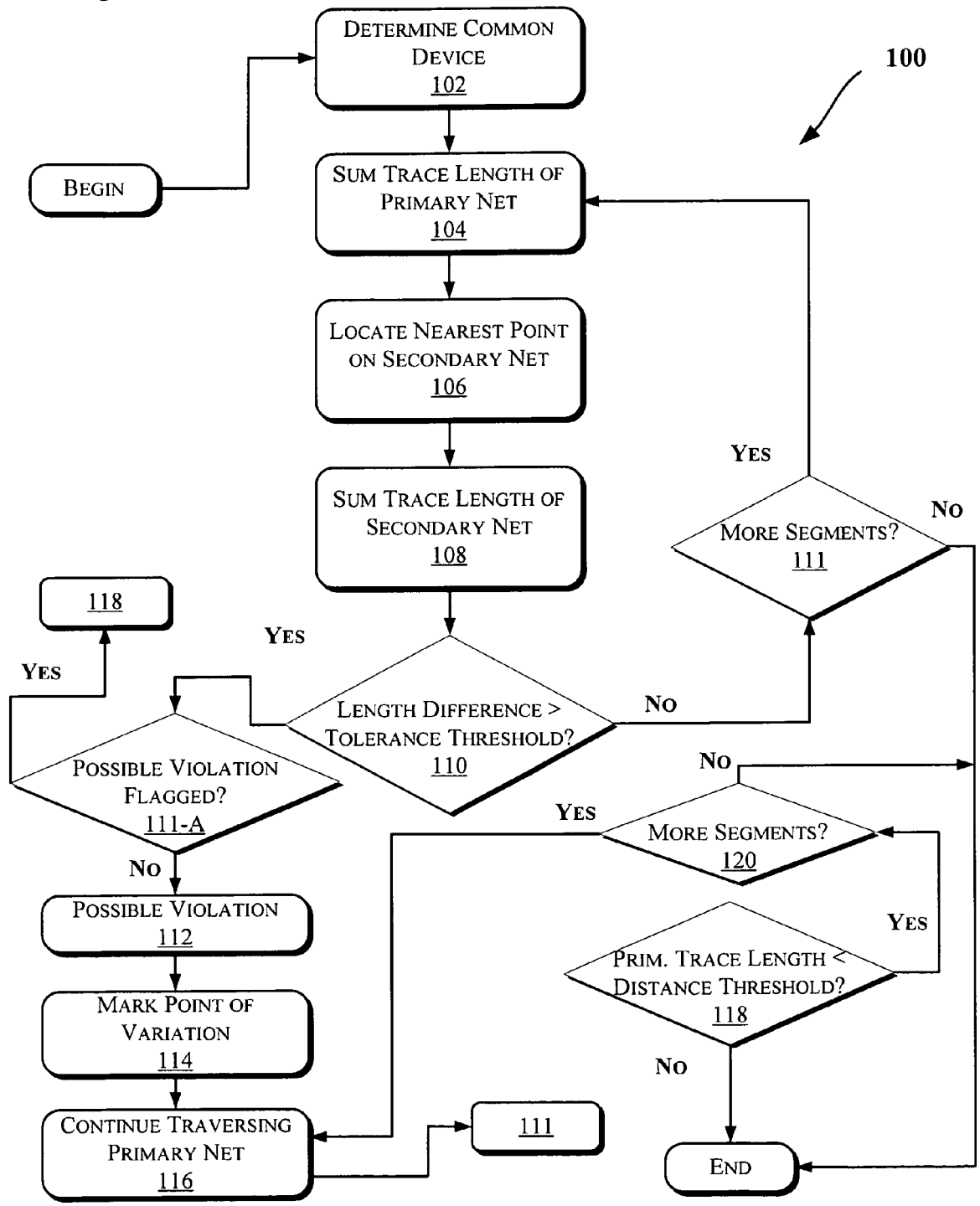
FIG. 1 illustrates a flow diagram of a method to validate continuous signal phase matching in high-speed nets, according to an embodiment.

FIG. 1 illustrates a flow diagram of a method 100 to validate continuous signal phase matching in high-speed nets, according to an embodiment. The nets may be routed as differential pairs in one embodiment. In one embodiment, various components discussed herein, e.g., with reference to FIGS. 2-4 may be utilized to perform one or more of the operations discussed with reference to FIG. 1.

Referring to FIG. 1, at an operation 102, a common device to be used as a starting point for both primary and secondary differential pair nets may be determined. In an embodiment, the common device may be specified by the user. Next, the primary net may be traversed from the starting point by a trace segment size (which may be determined by a user in an embodiment) and at each trace segment intermediate point, operations 104 through 110 may be performed.

More particularly, at an operation 104, the trace length of the primary net from its starting point to the intermediate point may be summed. At an operation 106, the nearest point on the secondary net may be located. At an operation 108, the trace length of the secondary net from its starting point to the located nearest point may be summed. And, at an operation 110, lengths in 104 and 106 may be compared and if the difference is greater than a specified threshold value for the phase mismatch tolerance (e.g., which may be user specified in an embodiment), an operation 111-A may determine whether a possible violation has already been flagged. If not, the routing may be flagged or reported as a possible violation at operation 112 (for example, by displaying a message on a display, such as the display discussed with reference to FIG. 3, or otherwise output, e.g., as a signal, etc.). Otherwise, if no possible violation has already been flagged, method 100 may continue at operation 118 which determines whether the trace length of the primary net from the point of variation to the intermediate point is less than a specified threshold value for phase mismatch correction distance (e.g., which may be user specified in an embodiment). Alternatively, if there are other segments at operation 111, the method may continue with the next segment at operation 104. As illustrated in FIG. 1, after operation 112 at an operation 114, the primary net's trace segment intermediate point is marked as the point of variation.

If a possible violation has been flagged at operation 112, the primary net may continue to be traversed intermediate point-to-intermediate point at operation 116. As shown in FIG. 1, after operation 118, an operation 120 may determine whether there are more segments before operation 116. In an embodiment, if the difference between the lengths in 104 and 106 never becomes lower than the phase mismatch tolerance at operation 110, the possible violation may be reported as an actual violation. In one embodiment, the phase mismatch is also tested at a distance from the point of variation equal to the specified phase mismatch correction distance parameter.

In some embodiments, it is assumed that the geometry of a package or PCB layout and routing is already comprehended by the DRC tool. It is also assumed that the user of the tool has already identified and paired the nets routed as differential pair signals. As discussed herein, one net may be referred to as the primary net, and the other net may be referred to as the secondary net. The tool may be applied to both of these nets. Further, as discussed herein, the two parameters of the automated check may include: (a) phase mismatch tolerance—the maximum allowable length mismatch between the differential pair nets (e.g., as discussed with reference to operation 108); and/or (b) phase mismatch correction distance—the maximum allowable distance in which to correct an intolerable phase mismatch after the point of variation (e.g., as discussed with reference to operation 118).

Figure 2:
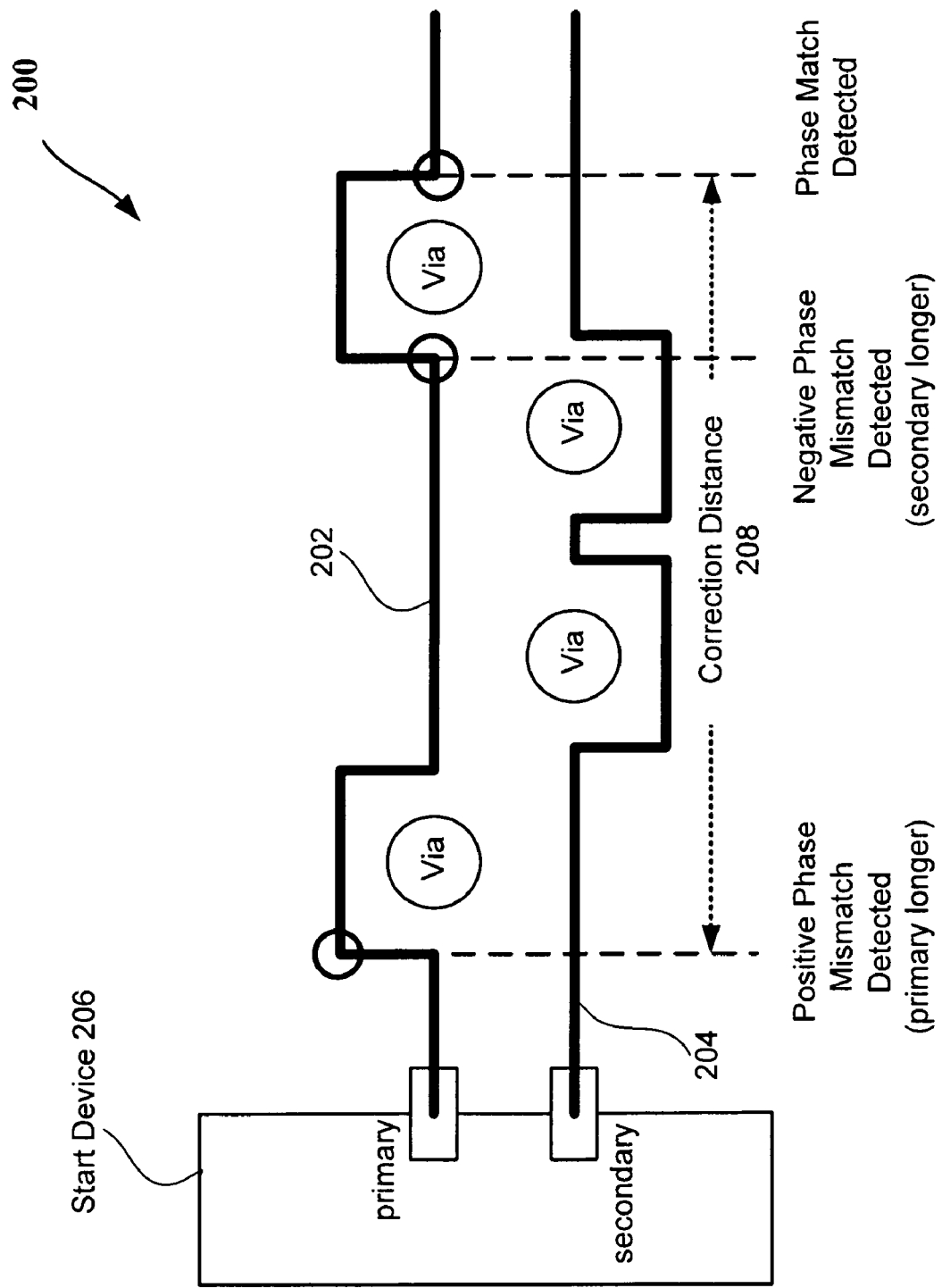
FIG. 2 illustrates a block diagram of various subjects of an automated design rule check tool, according to an embodiment.

FIG. 2 illustrates a block diagram 200 of various subjects of an automated design rule check tool, according to an embodiment. In FIG. 2, phase matching may occur at trace segment intermediate points of the primary differential pair net such as discussed with reference to FIG. 1 (e.g., at segment intermediate points shown with circles in FIG. 2). The differential pair nets (e.g., primary net 202 and secondary net 204) may come back into phase for a short time in the middle of the routing, but this may be undetected in some embodiments. In an embodiment, the automated check may be run twice, using each of the differential pair nets as the primary net.

Referring to FIGS. 1-2, a start device 206 may be determined at operation 102. The primary net 202 may be traversed at operations 104-108 at trace segment intervals such as shown in FIG. 2 (e.g., each circle indicates a trace segment intermediate point for example). As shown in FIG. 2, the differential pair nets (e.g., primary net 202 and secondary net 204) may be indicated a possible violation (e.g., as positive phase mismatch or negative phase mismatch within a correction distance 208) and as discussed with reference to operation 112 but not otherwise reported as an actual violation (e.g., see discussion of FIG. 1).

Moreover, a transmission line routed as a differential pair signal generally includes two nets (e.g., primary net and secondary net) that reference each other, for example, rather than a voltage net. The sampled signal is the difference between the signals contained in the two nets. This provides a more robust technique of transmission for high-speed nets because noise affecting both pairs is subtracted out in the sampling process. End-to-end length matching between the paired nets is generally important, especially for high-speed signals. Transmission time is proportional to net length, so the paired nets have nearly equal length to maintain the signal that is the differential between them. In some embodiments, length matching at frequent intervals along the routing may be performed, e.g., to ensure that the same part of the signal is affected by the same noise in each net. Once a length mismatch is detected, it may be corrected as soon as possible in an embodiment to minimize the area in which noise may simultaneously affect different parts of the signal.

Figure 3:
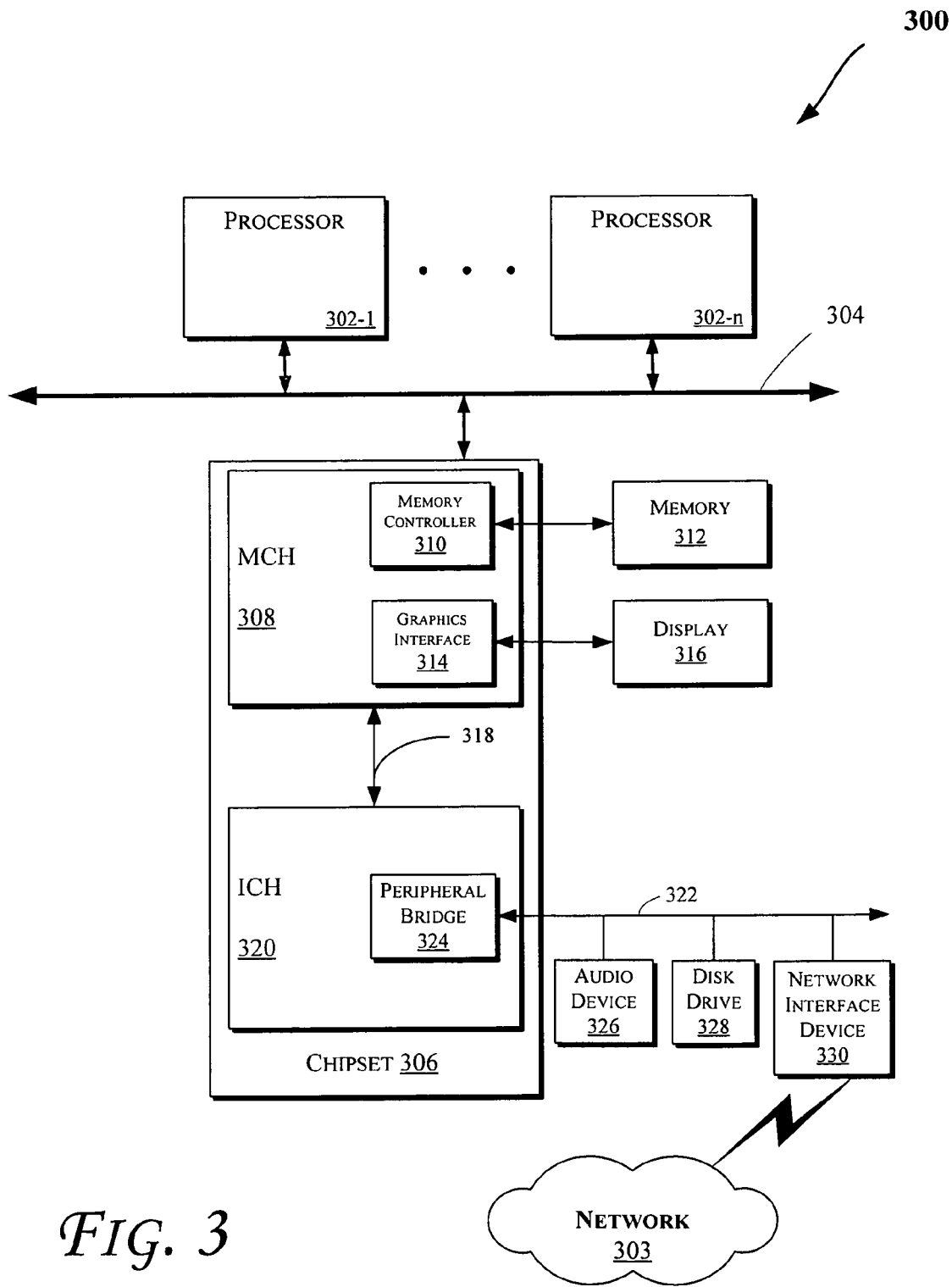
FIGS. 3 and 4 illustrate block diagrams of computing systems in accordance with various embodiments of the invention.

FIG. 3 illustrates a block diagram of a computing system 300 in accordance with an embodiment of the invention. The computing system 300 may include one or more central processing unit(s) (CPUs) 302 or processors that communicate via an interconnection network (or bus) 304. The processors 302 may include a general purpose processor, a network processor (that processes data communicated over a computer network 303), or other types of a processor (including a reduced instruction set computer (RISC) processor or a complex instruction set computer (CISC)). Moreover, the processors 302 may have a single or multiple core design. The processors 302 with a multiple core design may integrate different types of processor cores on the same IC die (such as dies 100 and 200 of FIGS. 1 and 2). Also, the processors 302 with a multiple core design may be implemented as symmetrical or asymmetrical multiprocessors. In an embodiment, one or more of the processors 302 may be provided in a device such as those discussed with reference to FIGS. 1 and 2. Also, the operations discussed with reference to FIGS. 1-2 may be performed by one or more components of the system 300.

A chipset 306 may also communicate with the interconnection network 304. The chipset 306 may include a memory control hub (MCH) 308. The MCH 308 may include a memory controller 310 that communicates with a memory 312. The memory 312 may store data, including sequences of instructions, that are executed by the CPU 302, or any other device included in the computing system 300. For example, operations discussed with reference to FIGS. 1-2 may be coded into instructions (e.g., stored in the memory 312) and executed by processor(s) 302. In one embodiment of the invention, the memory 312 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 304, such as multiple CPUs and/or multiple system memories.

The MCH 308 may also include a graphics interface 314 that communicates with a display device 316. In one embodiment of the invention, the graphics interface 314 may communicate with the display device 316 via an accelerated graphics port (AGP). In an embodiment of the invention, the display 316 (such as a flat panel display) may communicate with the graphics interface 314 through, for example, a signal converter that translates a digital representation of an image stored in a storage device such as video memory or system memory into display signals that are interpreted and displayed by the display 316. The display signals produced by the display device may pass through various control devices before being interpreted by and subsequently displayed on the display 316.

A hub interface 318 may allow the MCH 308 and an input/output control hub (ICH) 320 to communicate. The ICH 320 may provide an interface to I/O device(s) that communicate with the computing system 300. The ICH 320 may communicate with a bus 322 through a peripheral bridge (or controller) 324, such as a peripheral component interconnect (PCI) bridge, a universal serial bus (USB) controller, or other types of peripheral bridges or controllers. The bridge 324 may provide a data path between the CPU 302 and peripheral devices. Other types of topologies may be utilized. Also, multiple buses may communicate with the ICH 320, e.g., through multiple bridges or controllers. Moreover, other peripherals in communication with the ICH 320 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 322 may communicate with an audio device 326, one or more disk drive(s) 328, and a network interface device 330 (which is in communication with the computer network 303). Other devices may communicate via the bus 322. Also, various components (such as the network interface device 330) may communicate with the MCH 308 via a high speed (e.g., general purpose) I/O bus channel in some embodiments of the invention. In addition, the processor 302 and the MCH 308 may be combined to form a single chip. Furthermore, a graphics accelerator may be included within the MCH 308 in other embodiments of the invention.

Furthermore, the computing system 300 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 328), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 4:
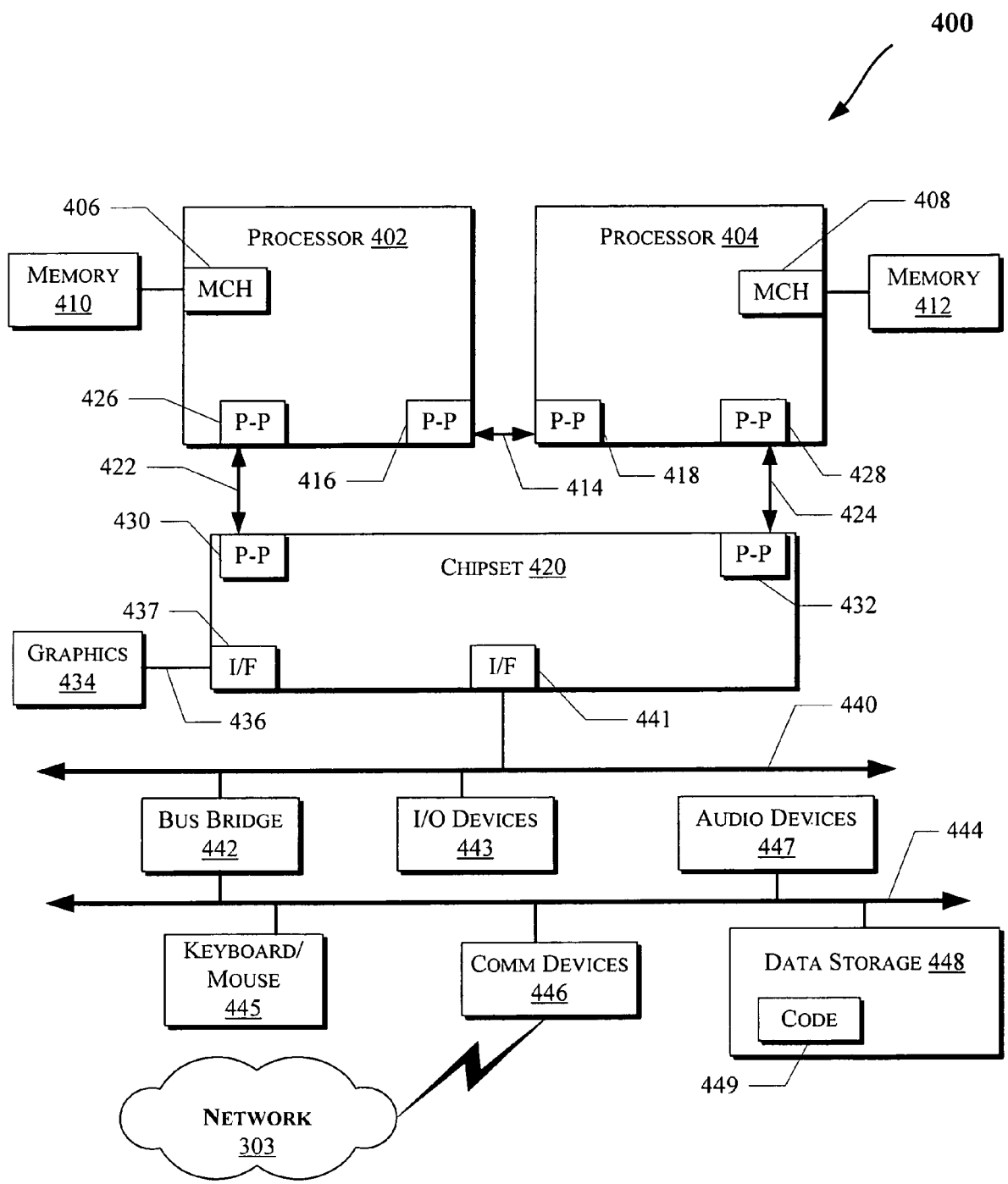

FIG. 4 illustrates a computing system 400 that is arranged in a point-to-point (PtP) configuration, according to an embodiment of the invention. In particular, FIG. 4 shows a system where processors, memory, and input/output devices are interconnected by a number of point-to-point interfaces. The operations discussed with reference to FIGS. 1-3 may be performed by one or more components of the system 400.

As illustrated in FIG. 4, the system 400 may include several processors, of which only two, processors 402 and 404 are shown for clarity. The processors 402 and 404 may each include a local memory controller (MC) 406 and 408 to enable communication with memories 410 and 412. The memories 410 and/or 412 may store various data such as those discussed with reference to the memory 312 of FIG. 3.

In an embodiment, the processors 402 and 404 may be one of the processors 302 discussed with reference to FIG. 3. The processors 402 and 404 may exchange data via a point-to-point (PtP) interface 414 using PtP interface circuits 416 and 418, respectively. Further, the processors 402 and 404 may include a high speed (e.g., general purpose) I/O bus channel in some embodiments of the invention to facilitate communication with various components (such as I/O device(s)). Also, the processors 402 and 404 may each exchange data with a chipset 420 via individual PtP interfaces 422 and 424 using point-to-point interface circuits 426, 428, 430, and 432. The chipset 420 may further exchange data with a graphics circuit 434 via a graphics interface 436, e.g., using a PtP interface circuit 437.

At least one embodiment of the invention may be provided within the processors 402 and 404. Other embodiments of the invention, however, may exist in other circuits, logic units, or devices within the system 400 of FIG. 4. Furthermore, other embodiments of the invention may be distributed throughout several circuits, logic units, or devices illustrated in FIG. 4.

The chipset 420 may communicate with a bus 440 using a PtP interface circuit 441. The bus 440 may communicate with one or more devices, such as a bus bridge 442 and I/O devices 443. Via a bus 444, the bus bridge 442 may communicate with other devices such as a keyboard/mouse 445, communication devices 446 (such as modems, network interface devices, or other communication devices that may communicate with the computer network 303), audio I/O device 447, and/or a data storage device 448. The data storage device 448 may store code 449 that may be executed by the processors 402 and/or 404.

In various embodiments of the invention, the operations discussed herein, e.g., with reference to FIGS. 1-4, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed herein.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection).

Reference in the specification to "one embodiment," "an embodiment," or "some embodiments" means that a particular feature, structure, or characteristic described in connection with the embodiment(s) may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A method comprising:
   traversing a first net of a differential pair from a starting point by a trace segment size value;
   at each trace segment intermediate point determined based on the trace segment size value:
     summing one or more trace lengths of each segment of the first net from the starting point to an intermediate point to determine a first sum;
     determining a point on a second net of the differential pair that is near the intermediate point; and
     summing one or more trace lengths of each segment of the second net from the starting point to the determined point on the second net to determine a second sum; and
   generating a signal, at an integrated circuit of a processor, to indicate status of a design rule violation based on a comparison of first sum and second sum against a first threshold value.

2. The method of claim 1, further comprising determining a device common to the first net and the second net, wherein the device is to be the starting point.

3. The method of claim 1, wherein the signal is to indicate a possible violation.

4. The method of claim 1, further comprising marking the intermediate point as a point of variation.

5. The method of claim 4, further comprising traversing the first net as long as a trace length of the first net from the point of variation to a current intermediate point is less than a second threshold value.

6. The method of claim 5, wherein the second threshold value corresponds to a phase mismatch correction distance.

7. The method of claim 5, further comprising determining the second threshold value based on user input.

8. The method of claim 1, further comprising determining the first threshold value based on user input.

9. The method of claim 1, wherein generating the signal is to be based on comparison of the first threshold value and a difference between the first sum and the second sum.

10. A non-transitory computer storage readable medium comprising one or more instructions that when executed on a processor configure the processor to:
   traverse a primary net of a differential pair from a starting point by a trace segment size value;
   at each trace segment intermediate point determined based on the trace segment size value:
      sum one or more trace lengths of each segment of the primary net from the starting point to an intermediate point to determine a first sum;
      determine a point on a secondary net of the differential pair that is near the intermediate point; and
      sum one or more trace lengths of each segment of the secondary net from the starting point to the determined point on the secondary net to determine a second sum; and
   indicate, at an integrated circuit of the processor status of a design rule violation based on a comparison of first sum and second sum against a first threshold value.

11. The computer-readable medium of claim 10, further comprising one or more instructions that configure the processor to cause generation of a signal to indicate the status of the design rule violation.

12. The computer-readable medium of claim 11, wherein the signal is to indicate a possible violation.

13. The computer-readable medium of claim 10, further comprising one or more instructions that configure the processor to determine a device common to the primary net and the secondary net, wherein the device is to be the starting point.

14. The computer-readable medium of claim 10, further comprising one or more instructions that configure the processor to mark the intermediate point as a point of variation.

15. The computer-readable medium of claim 10, further comprising one or more instructions that configure the processor to indicate the status of the design rule violation based on comparison of the first threshold value and a difference between the first sum and the second sum.

* * * * *